United States Patent
Nakano et al.

[11] Patent Number: 6,155,202
[45] Date of Patent: Dec. 5, 2000

[54] PLASMA PROCESSING APPARATUS, MATCHING BOX, AND FEEDER

[75] Inventors: Akira Nakano, Miyagi-ken, Japan; Sung Chul Kim, Kyongki-Do, Rep. of Korea; Koichi Fukuda, Miyagi-ken, Japan; Yasuhiro Takeda, Kanagawa-ken, Japan; Yasuhiko Kasama, Miyagi-ken, Japan; Tadahiro Ohmi, 2-1-17 Komegafukuro, Aoba-ku, Sendai-shi, Miyagi-ken, Japan; Shoichi Ono, Miyagi-ken, Japan

[73] Assignees: Alps Electric Co., Ltd., Tokyo; Frontec Incorporated; Tadahiro Ohmi, both of Miyagi-ken, all of Japan

[21] Appl. No.: 09/199,944

[22] Filed: Nov. 25, 1998

[30] Foreign Application Priority Data

Nov. 28, 1997 [JP] Japan ................................ 9-343684
Nov. 30, 1997 [JP] Japan ................................ 9-345851

[51] Int. Cl.[7] .............................. C23C 16/00; H01J 7/24; H01J 21/00
[52] U.S. Cl. .................... 118/723 E; 315/111.51; 315/111.21
[58] Field of Search .................. 156/345; 118/723 E, 118/723 I, 723 ER; 204/192.1–192.18, 298.01–298.41; 315/111.11, 111.21–111.91; 333/99 PL

[56] References Cited

U.S. PATENT DOCUMENTS

| 5,433,812 | 7/1995 | Cuomo et al. ......................... 156/345 |
| 5,445,709 | 8/1995 | Kojima et al. . |
| 5,650,032 | 7/1997 | Keller et al. ............................ 156/345 |

*Primary Examiner*—Gregory Mills
*Assistant Examiner*—Parviz Hassanzadeh
*Attorney, Agent, or Firm*—Brinks Hofer Gilson & Lione

[57] ABSTRACT

In a plasma processing apparatus, in a matching circuit intervening between a high-frequency power source and a plasma excitation electrode for achieving impedance matching between the high-frequency power source and the plasma excitation electrode, one of the two electrodes which form a tuning capacitor also serves as the plasma excitation electrode. Alternatively, in a plasma processing apparatus, the side wall of a housing made from an electrically conductive member and accommodating a matching circuit intervening between a high-frequency power source and a plasma excitation electrode for achieving impedance matching between the high-frequency power source and the plasma excitation electrode and a feeder for supplying high-frequency electric power from the high-frequency power source to the plasma excitation electrode through the matching circuit is formed not in parallel to the feeder.

18 Claims, 17 Drawing Sheets

PLASMA PROCESSING APPARATUS, MATCHING BOX, AND FEEDER

BACKGROUND OF THE INVENTION

1. Field of the Invention

The present invention relates to plasma processing apparatuses, and more particularly, to a plasma processing apparatus having a matching circuit between a high-frequency power source and a plasma electrode of the plasma processing apparatus.

The present invention also relates to plasma processing apparatuses, matching boxes, and feeders, and more particularly, to a matching box for intervening between a high-frequency power source and a plasma electrode of a plasma processing apparatus, a feeder for supplying high-frequency electric power from the matching box to the plasma electrode, and the plasma processing apparatus.

2. Description of the Related Art

There has been conventionally known a plasma processing apparatus shown in FIG. 11.

High-frequency electric power is supplied from a high-frequency power source 1 to a plasma excitation electrode 4 with a feeder 3 through a matching box 2 which is formed of a housing 21 made from an electrically conductive member and which accommodates a matching circuit in its inside.

Below the plasma excitation electrode 4, a shower plate 5 provided with a number of holes 7 is formed. Between the plasma excitation electrode 4 and the shower plate 5, there is formed a space 6. A gas feeding tube 17 is provided for the space 6. Gas fed through the gas feeding tube 17 is supplied through the holes 7 of the shower plate 5 to a chamber formed of a chamber wall 10. An insulating member 9 insulates the chamber wall 10 from the plasma excitation electrode 4.

In the chamber, a wafer susceptor 8 which also serves as a plasma excitation electrode and on which a substrate 16 is placed is provided. A susceptor shield 12 is provided therearound. The wafer susceptor 8 and the susceptor shield 12 are made movable up and down by bellows 11 so that the distance between the plasma excitation electrodes 4 and 8 can be adjusted.

The wafer susceptor 8 is connected to a second high-frequency power source 15 through a matching circuit accommodated into a matching box 14.

The matching box 2 is provided with a matching circuit shown in FIG. 12. The state of plasma excited in the chamber varies according to processing conditions such as the type of gas and pressure. Since the impedance thereof changes accordingly during discharge, an impedance between the high-frequency power source 1 and the plasma excitation electrode 4 is adjusted by the matching circuit such that a reflection wave of the output of a high-frequency wave applied is the minimum, in order to adjust plasma discharge. A tuning capacitor 24 is used for a part of this adjustment.

In the circuit shown in FIG. 12, a coil 23 and the tuning capacitor 24 are provided in series between the high-frequency power source 1 and the feeder 3. Another load capacitor 22 is connected to the high-frequency power source 1 and one end of the capacitor is grounded. The feeder 3 is usually formed of silver-plated copper 50 to 100 mm wide, 0.5 mm thick, and 100 to 300 mm long. The feeder 3 is screwed on the plasma excitation electrode 4.

In the matching circuit, the capacitance of the tuning capacitor 24 is adjusted to adjust the impedance between the high-frequency power source 1 and the plasma excitation electrode 4.

The inventor of the present invention examined the conventional plasma processing apparatus in detail and found, however, that power consumption efficiency (the rate of a power consumed in plasma to electric power supplied from the high-frequency power source 1 to the plasma excitation electrode 4) is not necessarily satisfactory, and the power consumption efficiency largely decreases as a capacitance between the plasma excitation electrode 4 and the chamber wall 10 of the plasma processing apparatus increases, as shown in FIG. 5.

The power consumption efficiency was examined as follows:

1. Change the chamber wall of the plasma processing apparatus to an equivalent circuit formed of a lumped-constant circuit.
2. Measure the impedance of each component of the chamber with the use of an impedance analyzer to determine the constant of each circuit.
3. Obtain the impedance of the whole chamber during discharge from the fact that the impedance of the whole chamber during discharge is complex conjugate with the impedance of the matching box to which a dummy load of 50 Ω is attached at the input side.
4. Assuming that a plasma space is a series circuit of a resistor R and a capacitor C, calculate the constant of each component from the values obtained from items 2 and 3.
5. Based on the equivalent circuit model during discharge obtained from the above method, perform circuit calculation to obtain the power consumption efficiency.

As described above, in the conventional plasma processing apparatus, a film forming speed is low due to a low power consumption efficiency. It is difficult to form an insulation film having a larger dielectric strength.

The inventor of the present invention sought out the reason for a low power consumption efficiency, and found that the feeder 3 might affect the efficiency. From various experiments based on this finding, the inventor of the present invention then found the power consumption efficiency can be increased by reducing the resistance of the inductance of the feeder to one hundredth, and has made the present invention.

There is also conventionally known a plasma processing apparatus shown in FIG. 18.

In the conventional plasma processing apparatus, a matching circuit intervenes between a high-frequency power source 101 and a plasma excitation electrode 104. The matching circuit is used for obtaining impedance matching between the high-frequency power source 101 and the plasma excitation electrode 104.

High-frequency electric power is supplied from the high-frequency power source 101 to the plasma excitation electrode 104 by a feeder 103.

The matching circuit and the feeder 103 are accommodated into a matching box 102 formed of a housing 121 made from an electrically conductive member.

Below the plasma excitation electrode 104, a shower plate 105 provided with a number of holes 107 is formed. Between the plasma excitation electrode 104 and the shower plate 105, there is formed a space 106. A gas feeding tube 117 is provided for the space 106. Gas fed through the gas feeding tube 117 is supplied through the holes 107 of the shower plate 105 to a chamber formed of a chamber wall 110. An insulating member 109 insulates the chamber wall 110 from the plasma excitation electrode 104. An exhausting system is omitted in the figure.

In the chamber, a wafer susceptor 108 which also serves as a plasma excitation electrode and on which a substrate 116 is placed is provided. A susceptor shield 112 is provided therearound. The wafer susceptor 108 and the susceptor shield 112 are made movable up and down by bellows 111 so that the distance between the plasma excitation electrodes 104 and 108 can be adjusted.

The wafer susceptor 108 is connected to a second high-frequency power source 115 through a matching circuit accommodated into a matching box 114.

FIG. 19 shows another conventional plasma processing apparatus.

In the plasma processing apparatus shown in FIG. 19, a shower plate is not used. A feeder 103 is disposed outside a matching box 102. In other words, a plasma excitation electrode 104 and the feeder 103 connected to the plasma excitation electrode 104 are accommodated into a plasma processing chamber. The other configurations are the same as those of the plasma processing apparatus shown in FIG. 18.

In either plasma processing apparatus, the state of plasma excited in the chamber varies according to processing conditions such as the type of gas and pressure. Since the impedance thereof changes accordingly during discharge, an impedance between the high-frequency power source 101 and the plasma excitation electrode 104 is adjusted by the matching circuit such that a reflection wave of the output of a high-frequency wave applied is the minimum, in order to adjust plasma discharge. A tuning capacitor 124 is used for a part of this adjustment.

In the circuits shown in FIGS. 18 and 19, a coil 123 and the tuning capacitor 124 are provided in series between the high-frequency power source 101 and the feeder 103. Another load capacitor 122 is connected to the high-frequency power source 101 and one end of the capacitor is grounded. The feeder 103 is usually formed of silver-plated copper 50 to 100 mm wide, 0.5 mm thick, and 100 to 300 mm long. The feeder 103 is screwed on the plasma excitation electrode 104.

In the matching circuit, the capacitance of the tuning capacitor 124 is adjusted to adjust the impedance between the high-frequency power source 101 and the plasma excitation electrode 104.

The inventor of the present invention examined the conventional plasma processing apparatus in detail and found, however, that power consumption efficiency (the rate of a power consumed in plasma to electric power supplied from the high-frequency power source 101 to the plasma excitation electrode 104) is not necessarily satisfactory, and the power consumption efficiency largely decreases as a capacitance between the plasma excitation electrode 104 and the chamber wall 110 of the plasma processing apparatus increases.

The power consumption efficiency was examined as follows:

1. Change the chamber wall of the plasma processing apparatus to an equivalent circuit formed of a lumped-constant circuit.
2. Measure the impedance of each component of the chamber with the use of an impedance analyzer to determine the constant of each circuit.
3. Obtain the impedance of the whole chamber during discharge from the fact that the impedance of the whole chamber during discharge is complex conjugate with the impedance of the matching box to which a dummy load of 50 Ω is attached at the input side.
4. Assuming that a plasma space is a series circuit of a resistor R and a capacitor C, calculate the constant of each component from the values obtained from items 2 and 3.
5. Based on the equivalent circuit model during discharge obtained from the above method, perform circuit calculation to obtain the power consumption efficiency.

As described above, in the conventional plasma processing apparatuses, a film forming speed is low due to a low power consumption efficiency. It is difficult to form an insulation film having a larger dielectric strength.

The inventor of the present invention sought out the reason for a low power consumption efficiency, and found the following.

In the conventional plasma processing apparatus, high-frequency electric power is supplied from the high-frequency power source 101 to the plasma excitation electrode (cathode electrode) 104 through a coaxial cable, the matching circuit, and the feeder 103. On the other hand, a high-frequency current flows into the plasma space through the components above, and then to an RF power source ground through another electrode (susceptor electrode) 108, the bellows 111, the chamber wall 110, and the housing chassis of the matching box.

Since the feeder 103 is parallel to the housing 121 of the matching box 102 which encloses the feeder 103 in the conventional plasma processing apparatus, the current flows parallel routes, the feeder 103 and the housing 121 of the matching box 102, in the go path and the return path to cause an increase of mutual inductance. As a result, it leads to a decrease in power consumption efficiency, and then a reduce in the film forming speed or a deterioration of film quality. The effect of the mutual inductance becomes large as the substrate 116 is extended. This means the effect is larger as the distance between the feeder 103 and the housing of the matching box 102 becomes longer. When the substrate is 40 to 50 cm long, the effect appears noticeably.

The inventor of the present invention first found the above phenomenon, which includes an issue to be solved.

SUMMARY OF THE INVENTION

Accordingly, it is an object of the present invention to provide a plasma processing apparatus which solves drawbacks in the conventional technologies, which has a high power consumption efficiency and a higher film forming speed than before, and which allows a higher-quality film to be formed.

Another object of the present invention is to provide a matching box for implementing a plasma processing apparatus which has a high power consumption efficiency and a higher film forming speed than before, and which allows a higher-quality film to be formed.

Yet another object of the present invention is to provide a feeder for implementing a plasma processing apparatus which has a high power consumption efficiency and a higher film forming speed than before, and which allows a higher-quality film to be formed.

One of the foregoing objects is achieved in one aspect of the present invention through the provision of a plasma processing apparatus, wherein one of at least two electrodes which form at least one tuning capacitor serves as a plasma excitation electrode in a matching circuit intervening between a high-frequency power source and the plasma excitation electrode for achieving impedance matching between the high-frequency power source and the plasma excitation electrode One of the foregoing objects is achieved in another aspect of the present invention through the provision of a plasma processing apparatus, wherein a matching circuit intervening between a high-frequency power source and a plasma excitation electrode for achieving impedance matching between the high-frequency power source and the plasma excitation electrode has a tuning capacitor and a fixed capacitor electrically connected in series or in parallel to the tuning capacitor, and one of at least two electrodes which form the fixed capacitor serves as the plasma excitation electrode.

One of the foregoing objects is achieved in yet another aspect of the present invention through the provision of a plasma processing apparatus, wherein the side wall of a housing made from an electrically conductive member and accommodating a matching circuit intervening between a high-frequency power source and a plasma excitation electrode for achieving impedance matching between the high-frequency power source and the plasma excitation electrode and a feeder for supplying high-frequency electric power from the high-frequency power source to the plasma excitation electrode through the matching circuit is formed not in parallel to the feeder.

One of the foregoing objects is achieved in still another aspect of the present invention through the provision of a plasma processing apparatus, wherein a feeder for supplying high-frequency electric power from a high-frequency power source to a plasma excitation electrode in a plasma processing chamber through a matching circuit intervening between the high-frequency power source and the plasma excitation electrode for achieving impedance matching between the high-frequency power source and the plasma excitation electrode is formed in the plasma processing chamber not in parallel to the side wall above the plasma excitation electrode, of the plasma processing chamber.

One of the foregoing objects is achieved in a further aspect of the present invention through the provision of a matching box including: an impedance matching circuit and a housing made from an electrically conductive member and accommodating the matching circuit, wherein the housing has a cone shape, a truncated cone shape, a pyramid shape, or a truncated pyramid shape.

One of the foregoing objects is achieved in a yet further aspect of the present invention through the provision of a feeder having a cone shape, a truncated cone shape, a pyramid shape, or a truncated pyramid shape.

According to the present invention, the power consumption efficiency can be increased, the film forming speed can be made faster than before, and a higher-quality film can be generated.

DESCRIPTION OF THE PREFERRED EMBODIMENTS

First Embodiment

Figure 1:
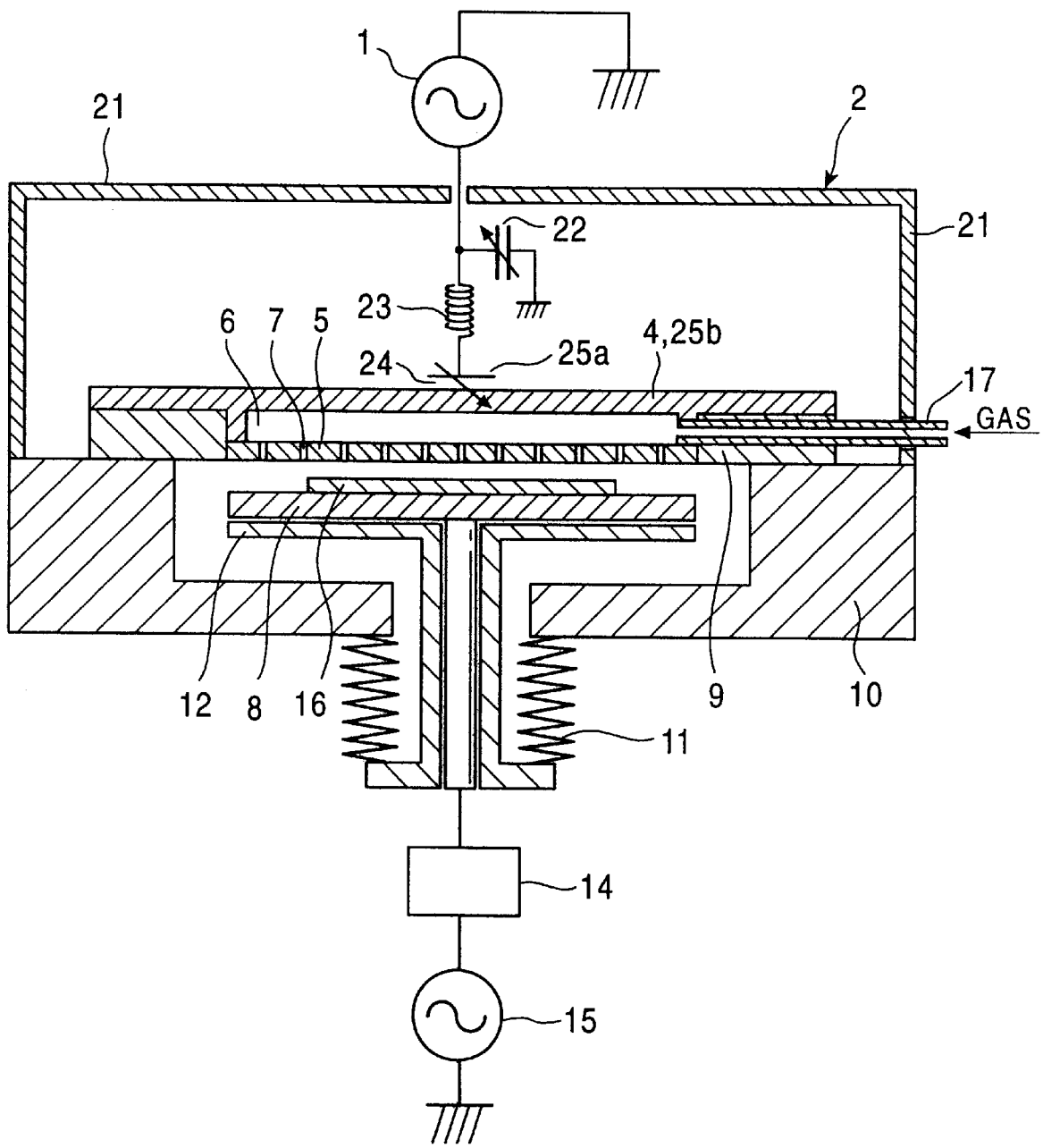
FIG. 1 is a cross section of a plasma processing apparatus according to a first embodiment of the present invention.

FIG. 1 shows a plasma processing apparatus according to a first embodiment of the present invention.

In this embodiment, in a matching circuit intervening between a high-frequency power source 1 and a plasma excitation electrode 4 for achieving impedance matching between the high-frequency power source 1 and the plasma excitation electrode 4, the plasma excitation electrode 4 also serves as one electrode 25b which forms one tuning capacitor 24 together with an electrode 25b.

The present invention will be described below in detail. The descriptions of the same portions as those in the conventional cases will be omitted.

In the present embodiment, one electrode 25b of the two electrodes 25a and 25b constituting the tuning capacitor 24 also serves as the plasma excitation electrode 4.

Figure 2:
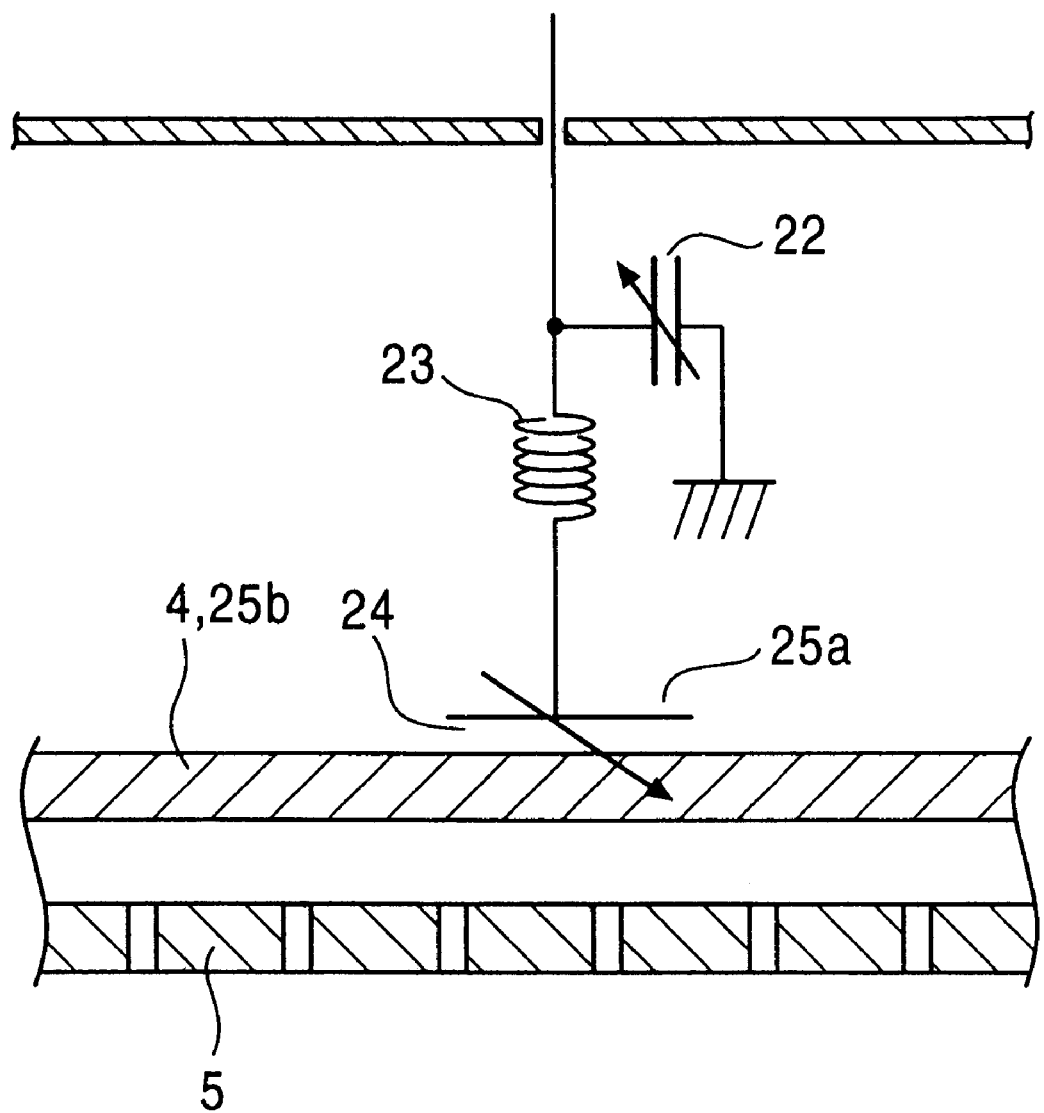
FIG. 2 is an enlarged view of a matching box shown in FIG. 1.

The matching circuit in a matching box 21 is illustrated by a circuit diagram shown in FIG. 2. The specific configuration of the tuning capacitor 24 is shown in FIG. 3.

Figure 3:
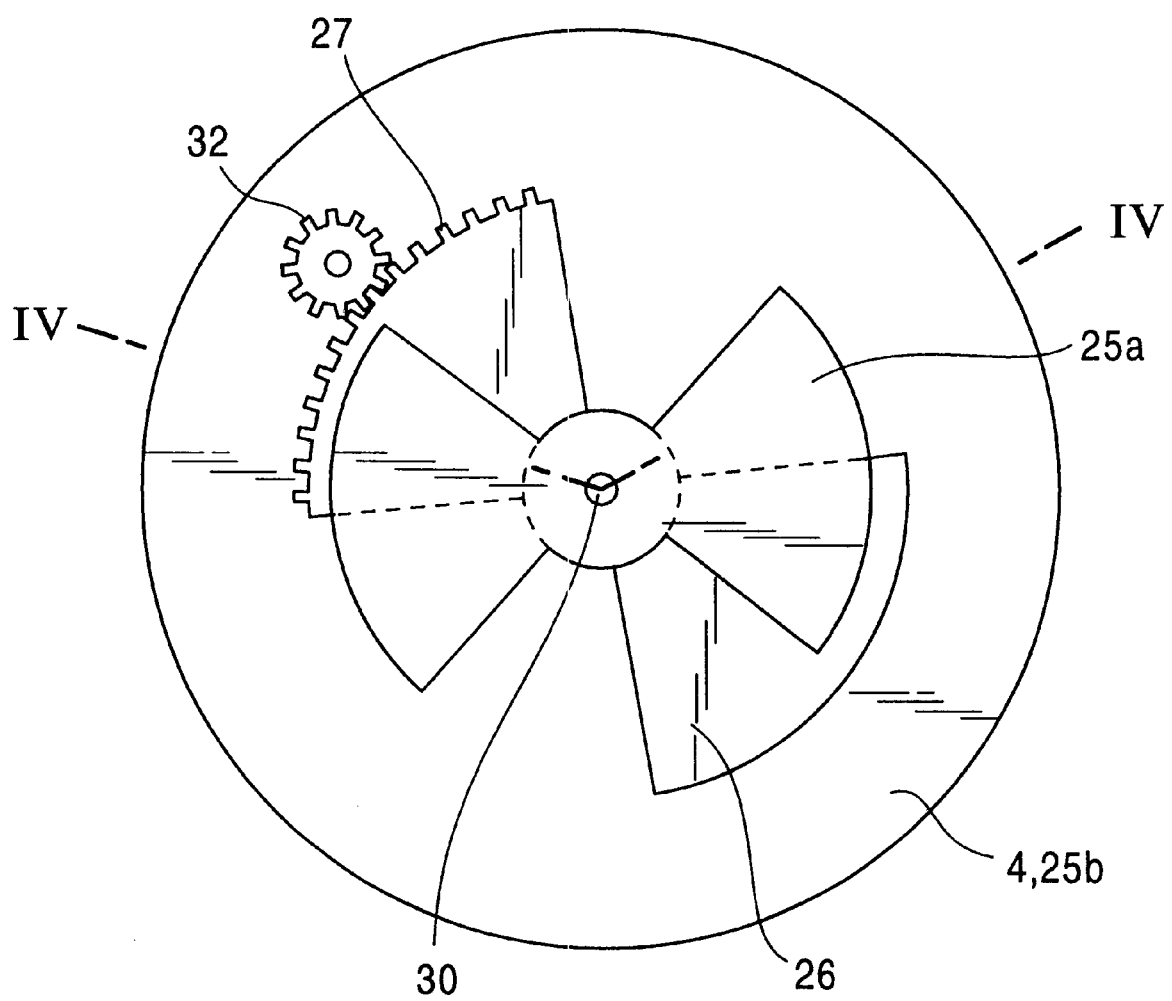
FIG. 3 is plan showing a specific configuration of a tuning capacitor shown in FIG. 1.
Figure 4:
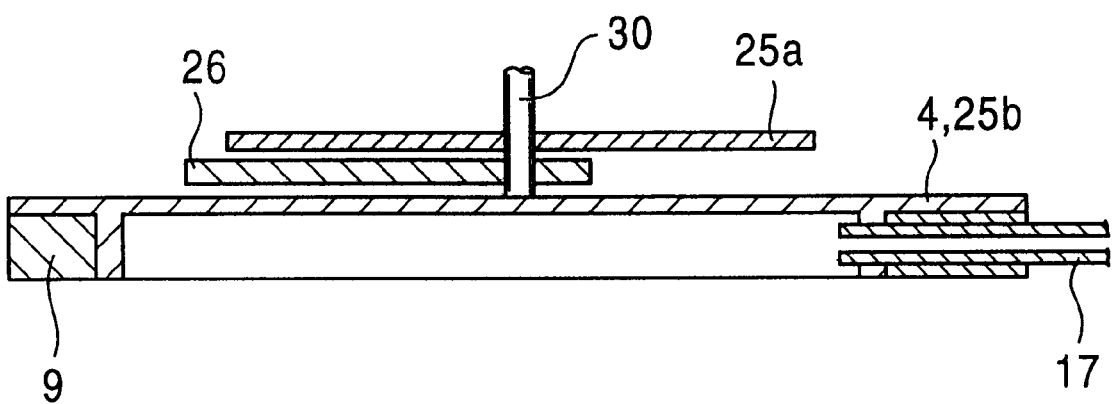
FIG. 4 is a cross section taken on line IV—IV of FIG. 3.
Figure 5:
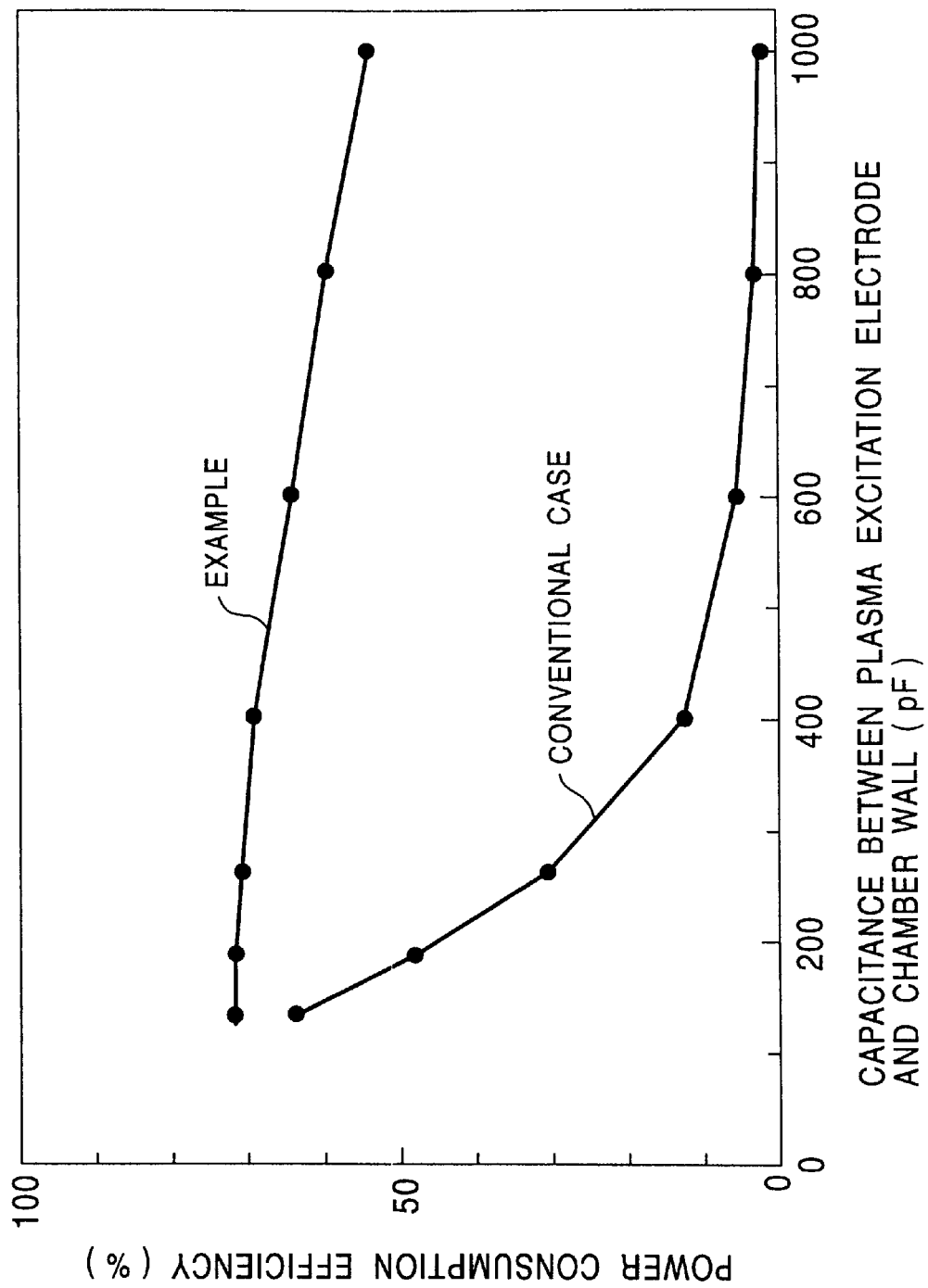
FIG. 5 is a graph showing power consumption efficiency in the apparatus according to the first embodiment.

As shown in FIGS. 3 and 4, the tuning capacitor is of a butterfly type. Above the plasma excitation electrode 4 (also serving as the electrode 25b of the tuning capacitor), an insulating plate 26 having notches is rotatably supported by a shaft 30 made from an insulating material. In the present embodiment, the insulating plate has sector-shaped notches. The electrode 25a is secured to the shaft 30 so as to sandwich the insulating plate 26 together with the electrode 25b.

When the insulating plate 26 is rotated, an overlapped area of the electrode 25a and the insulating plate 26 changes. Tuning is performed such that the desired capacitance is obtained between the electrodes 25a and 25b.

The electrode 25a and the insulating plate 26 need to be relatively rotated. They may be configured such that the insulating plate 26 is secured and the electrode 25a is rotated. Since the electrode 25a needs to be connected to a coil 23, if the electrode 25a is configured so as to be rotated, an mechanism for rotating the coils 23 is required. This makes the structure complicated. Therefore, to avoid such a complicated structure, it is preferred that the electrode 25a be secured and the insulating plate 26 be rotated.

Means for rotating the insulating plate 26 is not limited. For example, as shown in FIGS. 3 and 4, the insulating plate 26 is provided with grooves 27 at least at a part of its side face and a gear 32 appropriate for the grooves 27 is formed to rotate the insulating plate 26.

A gas feeding tube 17 is formed at a side face of the plasma excitation electrode 4 in the present embodiment whereas the tube 17 is formed above the plasma excitation electrode 4 in the conventional cases.

Power consumption efficiency was measured in the apparatus shown in FIG. 1. The power consumption efficiency decreased very slightly even when the capacitance between a chamber wall 10 and the plasma excitation electrode 4 became larger.

An insulating film (silicon nitride film) was formed with the use of the plasma processing apparatus of the present embodiment and a conventional plasma processing apparatus. A film forming speed and film quality were measured.

In the conventional plasma processing apparatus, silver-plated copper having a width of 100 mm, a thickness of 0.5 mm, and a length of 100 mm was used as the feeder 3.

The following film forming conditions were used.

Substrate temperature: 300° C.

Power of high-frequency power source 1: 400 W

Power of high-frequency power source 15: 0 W

Gas: $SiH_4$:$NH_3$:$N_2$=40:160:600 (sccm)

Figure 6:
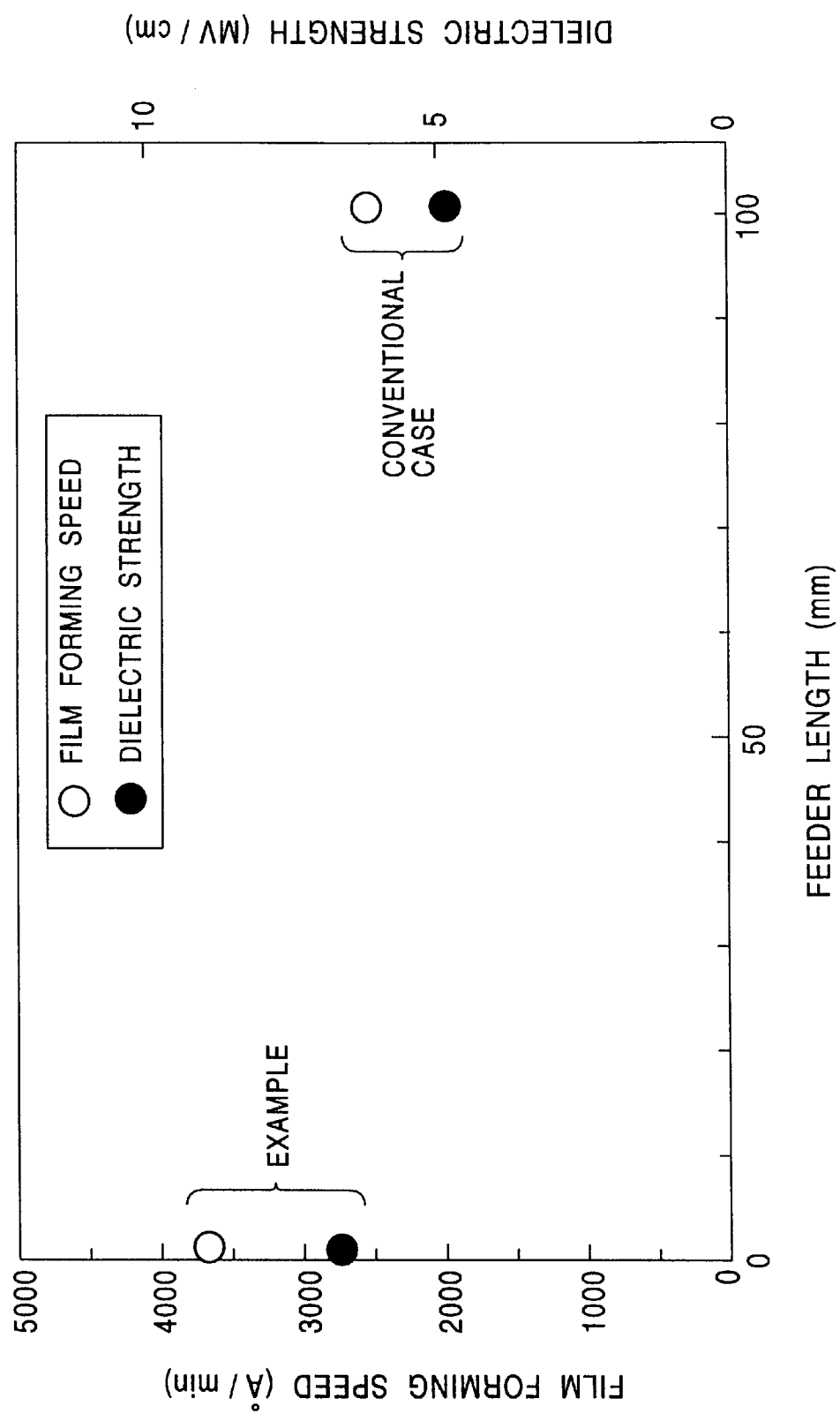
FIG. 6 is a graph showing results of a film forming experiment with the use of the plasma processing apparatus according to the first embodiment and a conventional one in terms of a film forming speed and dielectric strength.

The results are shown in FIG. 6. In FIG. 6, each white circle indicates a film forming speed and each black circle indicates the dielectric strength of a formed insulating film. The feeder length was set to 100 mm in the conventional apparatus and it was set to 0 mm in the apparatus according to the present embodiment.

As shown in FIG. 6, the film forming speed and the dielectric strength in the present embodiment are about 1.4 times as large as those in the conventional case.

Second Embodiment

Figure 7A:
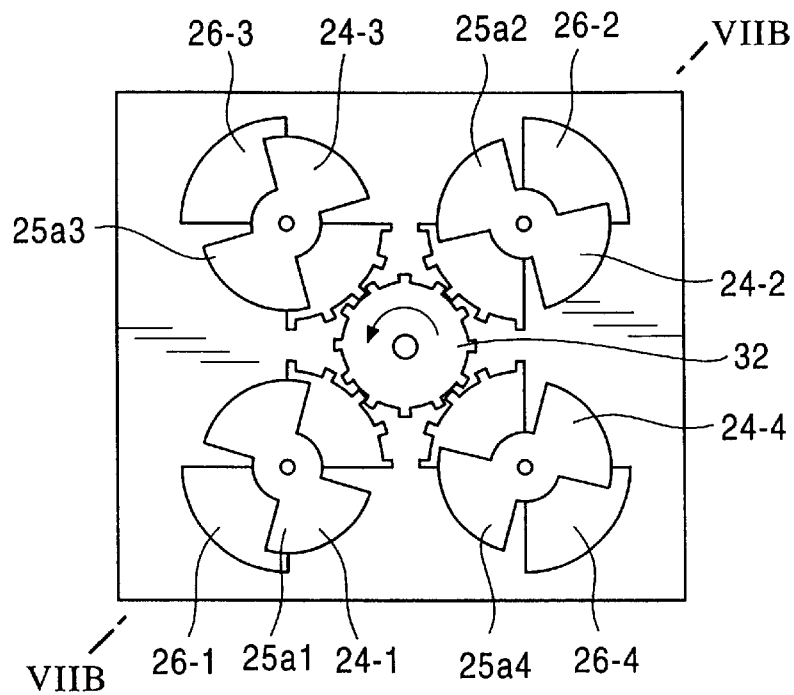
FIGS. 7A and 7B are an outlined cross section and an outlined plan of a part of a plasma processing apparatus according to a second embodiment.
Figure 7B:
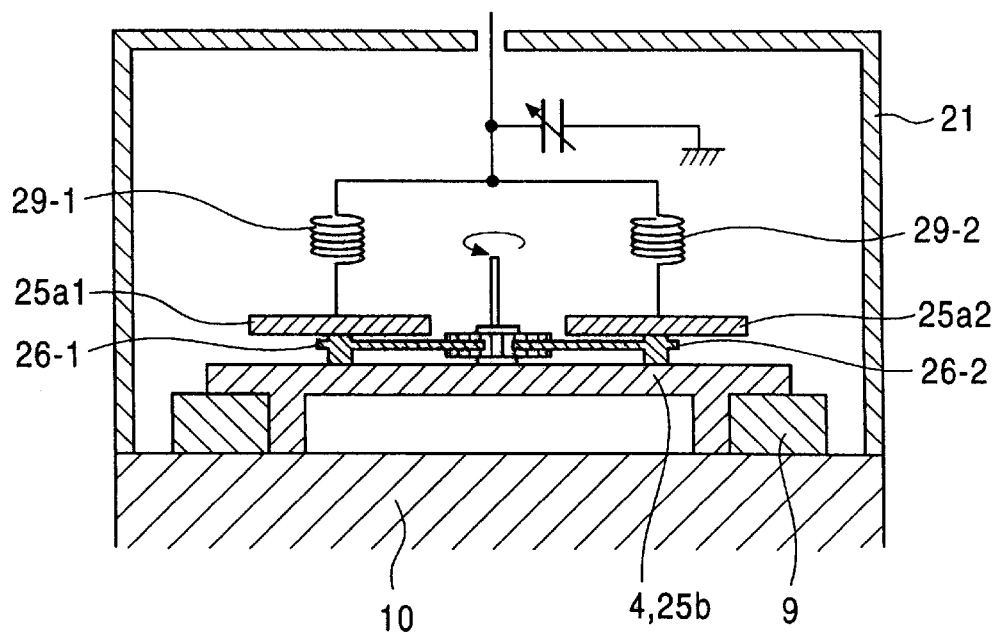

FIGS. 7A and 7B show a plasma processing apparatus according to a second embodiment of the present invention.

In the present embodiment, tuning capacitors 24-1, 24-2, 24-3, and 24-4 connected to coils 29-1 and 29-2, respectively, are formed in parallel. In FIGS. 7A and 7B, there are formed four tuning capacitors each identical with the tuning capacitor having the configuration shown in the first embodiment. In other words, the tuning capacitors 24-1, 24-2, 24-3, and 24-4 use a plasma excitation electrode 4 (25b) as a common electrode and are configured such that rotatable insulating plates 26-1, 26-2, 26-3, and 26-4 are sandwiched by electrodes 25a1, 25a2, 25a3, and 25a4 and the plasma excitation electrode 4 (25b), respectively.

The four tuning capacitors 24-1, 24-2, 24-3, and 24-4 are disposed so as to be substantially symmetric about the center of the plasma excitation electrode 4.

A gear 32 is provided at the center of the four tuning capacitors 24-1, 24-2, 24-3, and 24-4. Grooves provided for the insulating plates 26-1, 26-2, 26-3, and 26-4 of the tuning capacitors 24-1, 24-2, 24-3, and 24-4 are engaged with the gear 32, so that the insulating plates 26-1, 26-2, 26-3, and 26-4 are rotated at the same time to set the capacitances of the tuning capacitors 24-1, 24-2, 24-3, and 24-4 to the desired values.

If the size (the longest distance from the center, where power is supplied, to a peripheral of the electrode) of the plasma excitation electrode 4 is larger than one fourth the wavelength of a plasma excitation signal, a standing wave causes a problem. Generally, it is preferred that the size of the plasma electrode 4 be smaller than one tenth the wavelength of the plasma excitation signal. In the present embodiment, the foregoing problem is avoided because a plurality of the tuning capacitors 24-1, 24-2, 24-3, and 24-4 are provided. It is also preferred that the shortest distance between adjacent tuning capacitors be smaller than one tenth the wavelength of the plasma excitation signal, which is sufficiently smaller than the wavelength.

In the present embodiment, since the plurality of the tuning capacitors 24-1, 24-2, 24-3, and 24-4 are disposed so as to be substantially symmetric about the center of the plasma excitation electrode 4, high-frequency electric power is uniformly supplied to the plasma excitation electrode 4.

Third Embodiment

Figure 8:
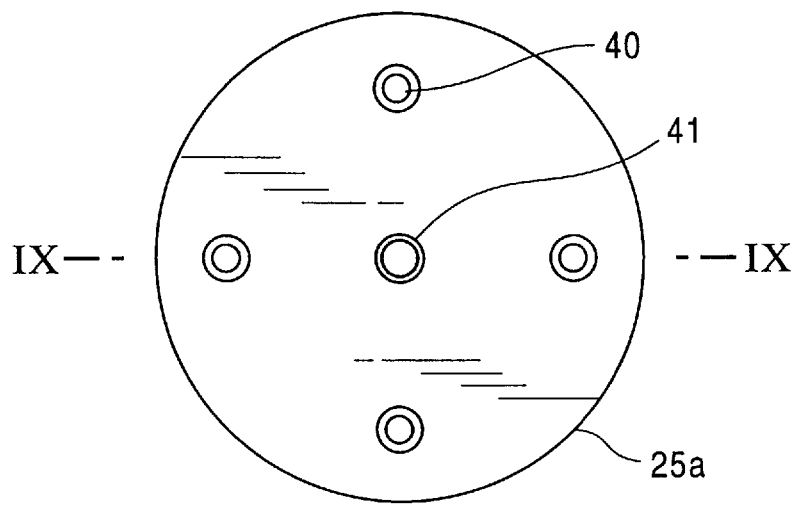
FIG. 8 is a plan of a tuning capacitor in a plasma processing apparatus according to a third embodiment.
Figure 9:
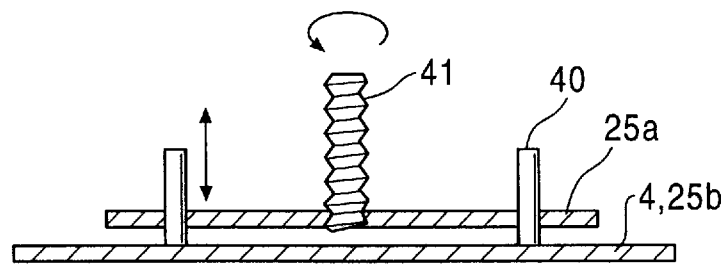
FIG. 9 is a cross section taken on line IX—IX of FIG. 8.

FIGS. 8 and 9 show a third embodiment.

In this embodiment, a screw-type tuning capacitor is used.

An electrode 25a screwed to a screw shaft 41 is disposed above a plasma excitation electrode 4 (25b). Guide shafts 40 are made from an insulating material.

The screw shaft 41 is rotated to move the electrode 25a up and down along the guide shafts 40, and thereby the capacitance between the electrode 25a and the plasma excitation electrode 4 (25b) is adjusted to the desired value.

In the present embodiment, since the distance between the electrode 25a and the plasma excitation electrode 4 (25b) is variable by the pitch of the screw, the capacitance therebetween can be adjusted at a high precision.

Fourth Embodiment

Figure 10:
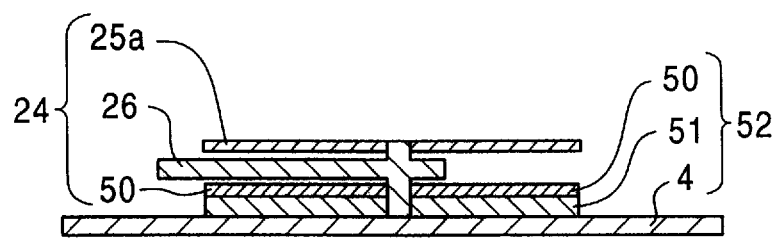
FIG. 10 is a cross section of a tuning capacitor in a plasma processing apparatus according to a fourth embodiment.
Figure 11:
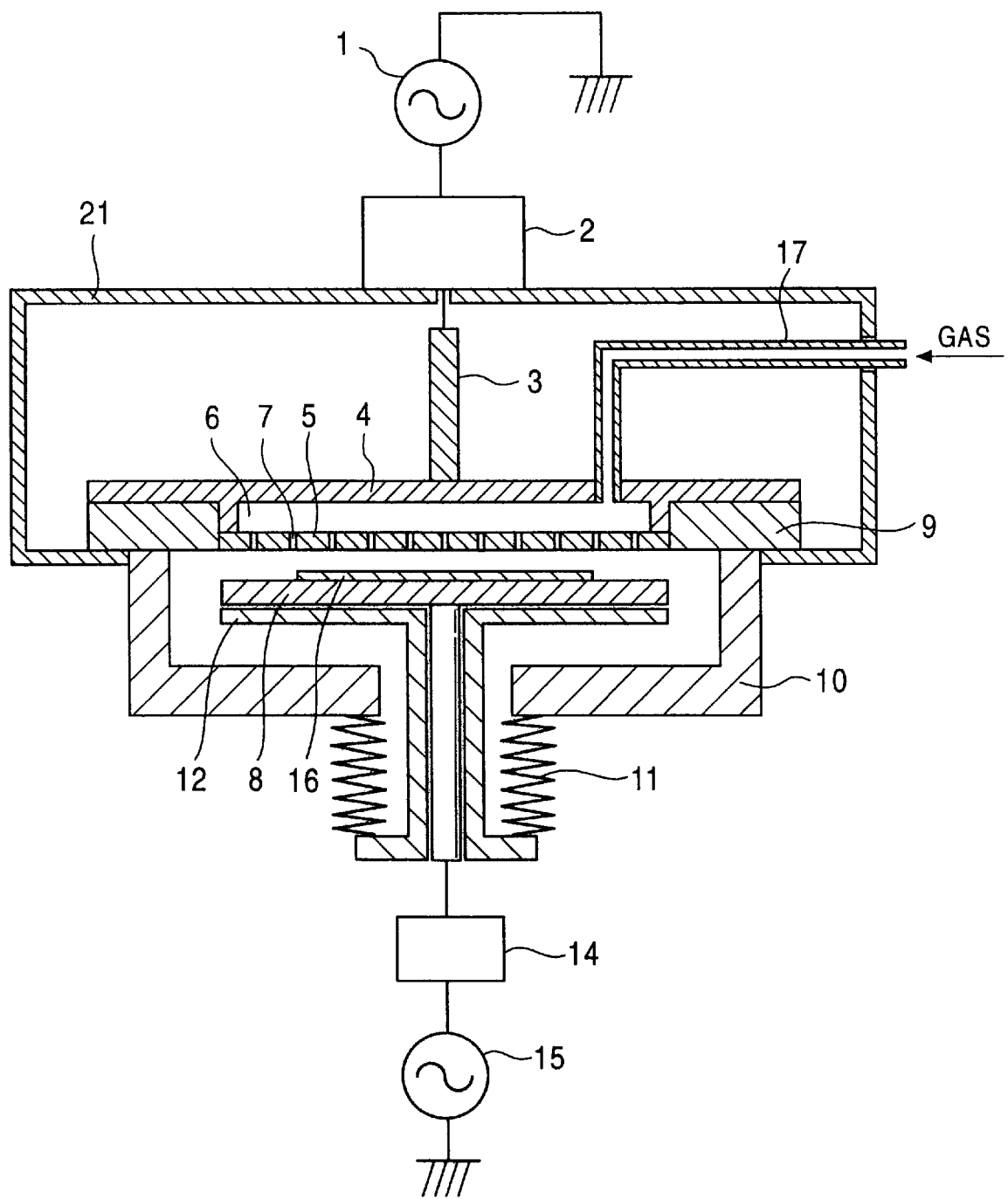
FIG. 11 is a cross section of a conventional plasma processing apparatus.
Figure 12:
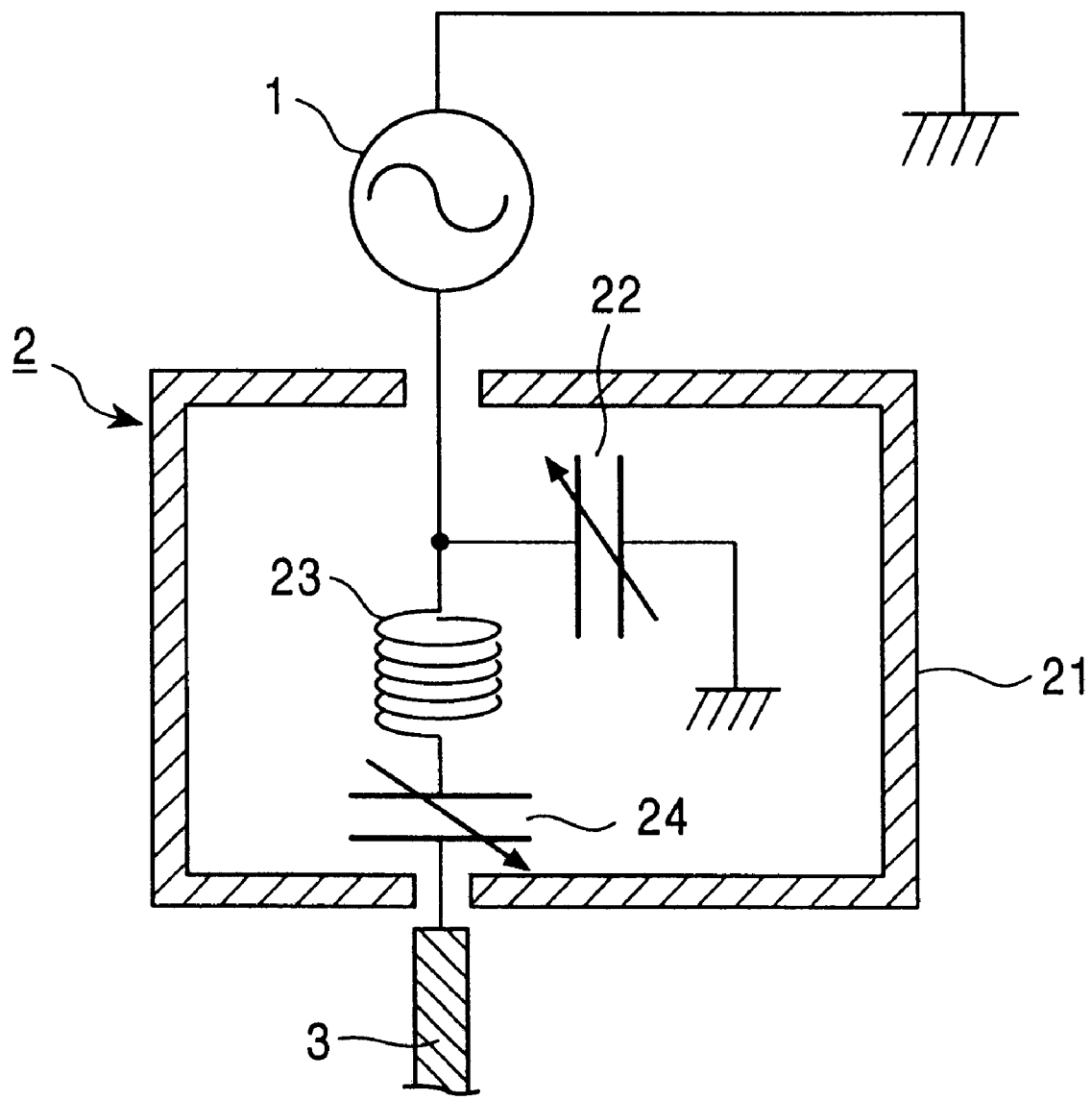
FIG. 12 is a cross section showing a circuit configuration of a matching box shown in FIG. 11.

FIG. 10 shows a fourth embodiment.

In the present embodiment, a fixed capacitor is provided between a tuning capacitor and a plasma excitation electrode. One electrode of the fixed capacitor also serves as the plasma excitation electrode.

In a matching circuit intervening between a high-frequency power source 1 and the plasma excitation electrode 4 for achieving impedance matching between the high-frequency power source 1 and the plasma excitation electrode 4, the tuning capacitor 24 and the fixed capacitor 52 electrically connected to the tuning capacitor 24 in series or in parallel are provided. One of at least two electrodes of the fixed capacitor 52 serves as the plasma excitation electrode 4.

The tuning capacitor shown in FIG. 10 is of a butterfly type and is configured such that an insulating plate 26 is sandwiched by an electrode 25a and one electrode 50 of the fixed capacitor. The electrode 25a and the insulating plate 26 have sector-shaped notches in the same way as shown in the first embodiment. Tuning is achieved by rotating the insulating plate 26. In the present embodiment, the insulating plate 26 is formed with a shaft as a unit.

On the other hand, the fixed capacitor 52 is configured such that the plasma excitation electrode 4 serves as one electrode thereof and an insulating plate 51 intervenes between the electrode 50 and the plasma excitation electrode 4.

In FIG. 10, the fixed capacitor 52 is connected in series to the tuning capacitor 24. The fixed capacitor may be connected in parallel to the tuning capacitor 24.

For the same reason as that why a plurality of tuning capacitors are provided, it is preferred that a plurality of fixed capacitors be provided. In this case, it is preferred that the fixed capacitors be disposed so as to be substantially symmetric about the center of the plasma excitation electrode.

Fifth Embodiment

Figure 13:
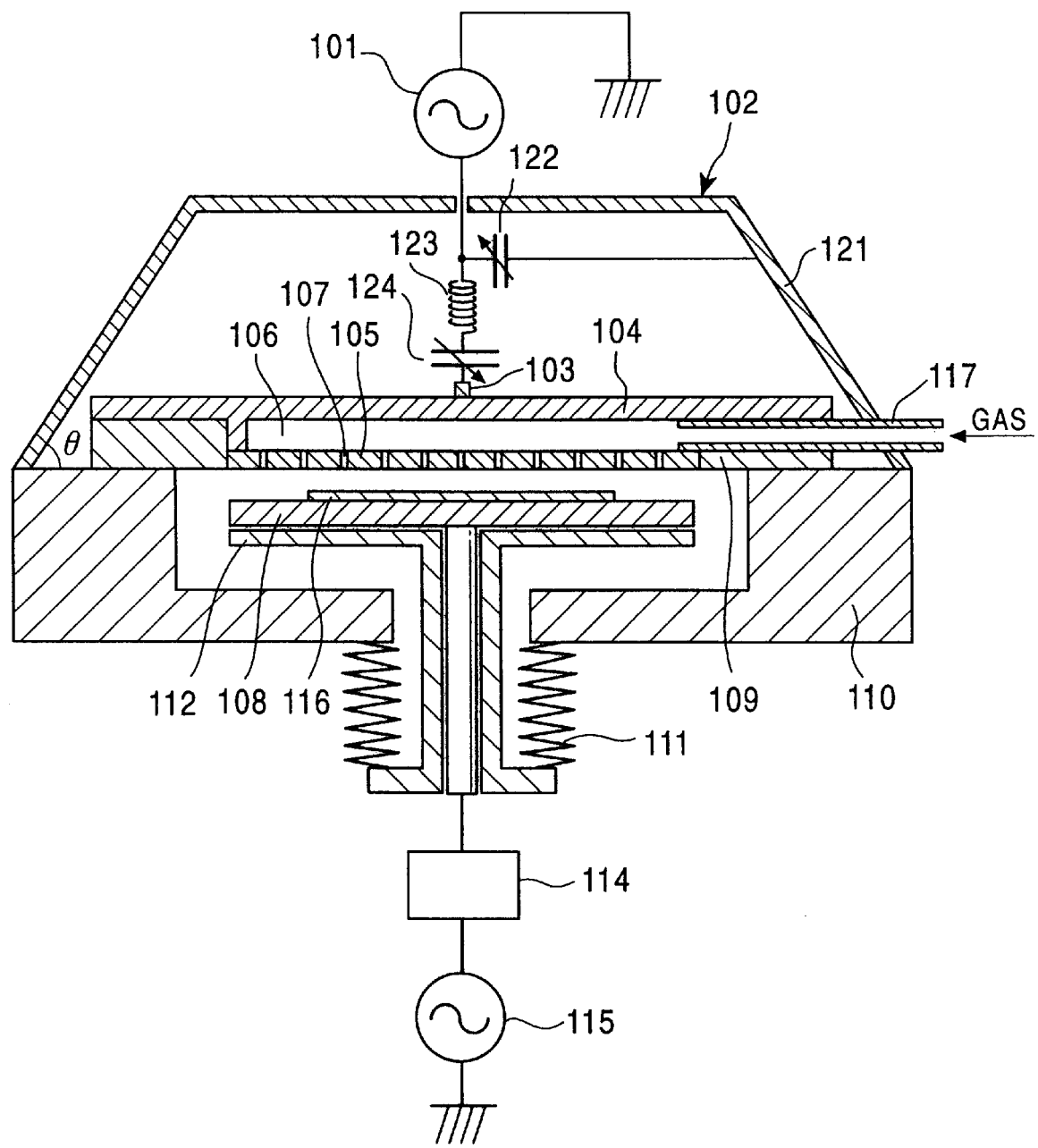
FIG. 13 is a cross section of a plasma processing apparatus according to a fifth embodiment.

FIG. 13 shows a plasma processing apparatus according to a fifth embodiment of the present invention.

In the plasma processing apparatus according to the present embodiment, the side wall of a housing 121 made from an electrically conductive member and accommodating a matching circuit intervening between a high-frequency power source 101 and a plasma excitation electrode 104 for achieving impedance matching between the high-frequency power source 101 and the plasma excitation electrode 104 and a feeder 103 for supplying high-frequency electric power from the high-frequency power source 101 to the plasma excitation electrode 104 through the matching circuit is formed not in parallel to the feeder 103.

The present invention will be described below in detail. The descriptions of the same portions as those in the conventional cases will be omitted.

In the present embodiment, plate-shaped, silver-plated copper 100 mm wide, 0.5 mm thick, and 100 mm long is used as the feeder 103, and the feeder 103 is screwed at the center of the plasma excitation electrode 104.

The feeder 103 is accommodated into a matching box 102 and is formed and disposed in the normal direction to the plasma excitation electrode 104.

On the other hand, the housing 121 of the matching box 102 has a truncated cone shape and is disposed at an angle of about 45 degrees (θ shown in FIG. 13) against the plasma excitation electrode 104. It is preferred that this angle θ be 45 degrees or less.

In the present embodiment, the bottom surface of the housing of the matching box 102 has a square shape.

A gas feeding tube 117 is formed at a side face of the plasma excitation electrode 104 in the present embodiment whereas the tube 117 is formed above the plasma excitation electrode 104 in the conventional cases.

Figure 18:
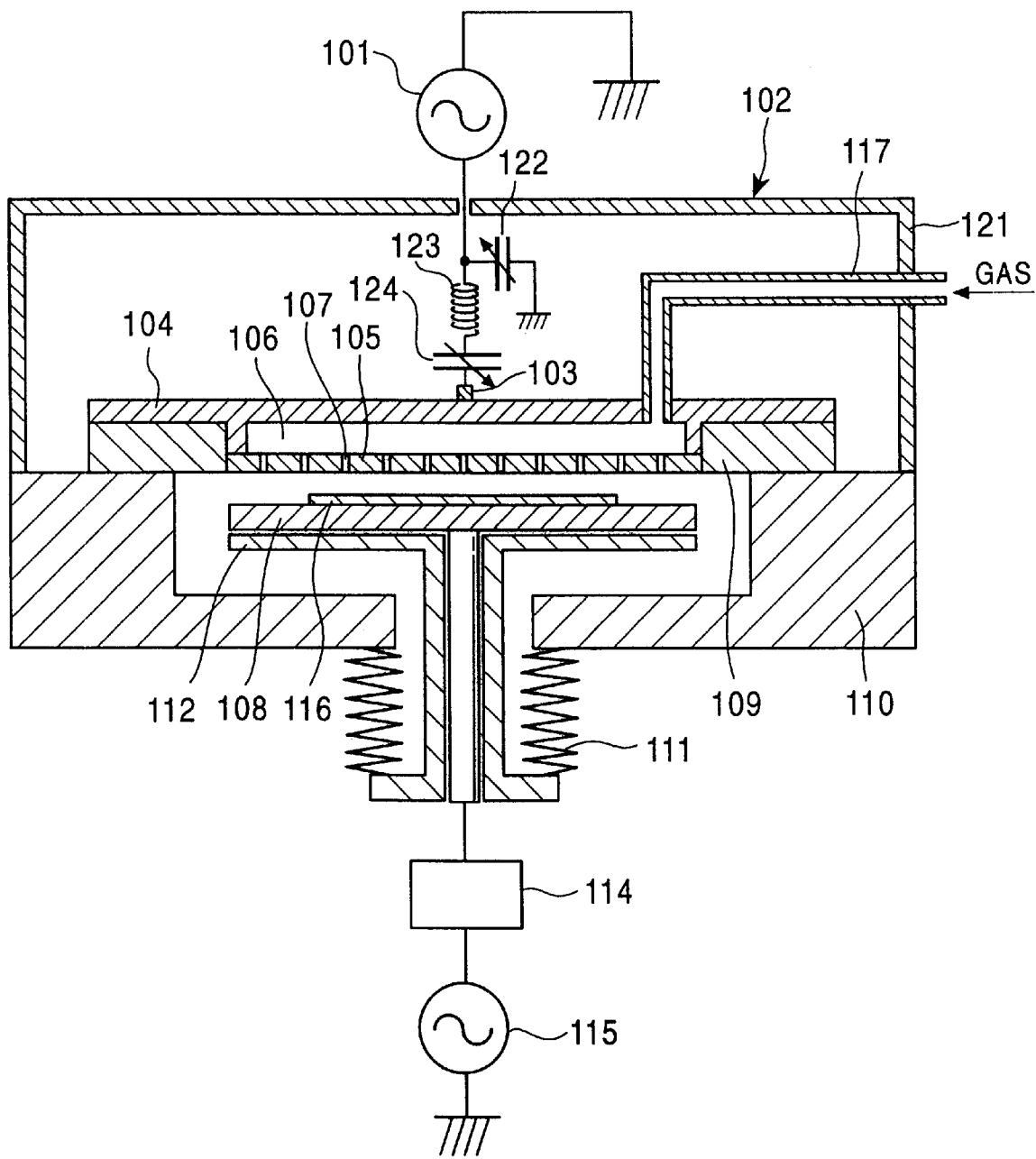
FIG. 18 is a cross section of another conventional plasma processing apparatus.

A silicon nitride film was formed with the use of the plasma processing apparatus of the present embodiment and the conventional plasma processing apparatus shown in FIG. 18, and power consumption efficiency, a film forming speed, and dielectric strength were measured. In the plasma processing apparatus of the present embodiment, the power consumption efficiency was about 1.5 times larger, the film forming speed was about 1.2 times larger, and the dielectric strength was about 1.2 times larger than in the plasma processing apparatus shown in FIG. 18.

The following film forming conditions were used.
Substrate temperature: 300° C.
Power of high-frequency power source 101: 400 W
Power of high-frequency power source 115: 0 W
Gas: $SiH_4$:$NH_3$:$N_2$=40:160:600 (sccm)

Sixth Embodiment

Figure 14:
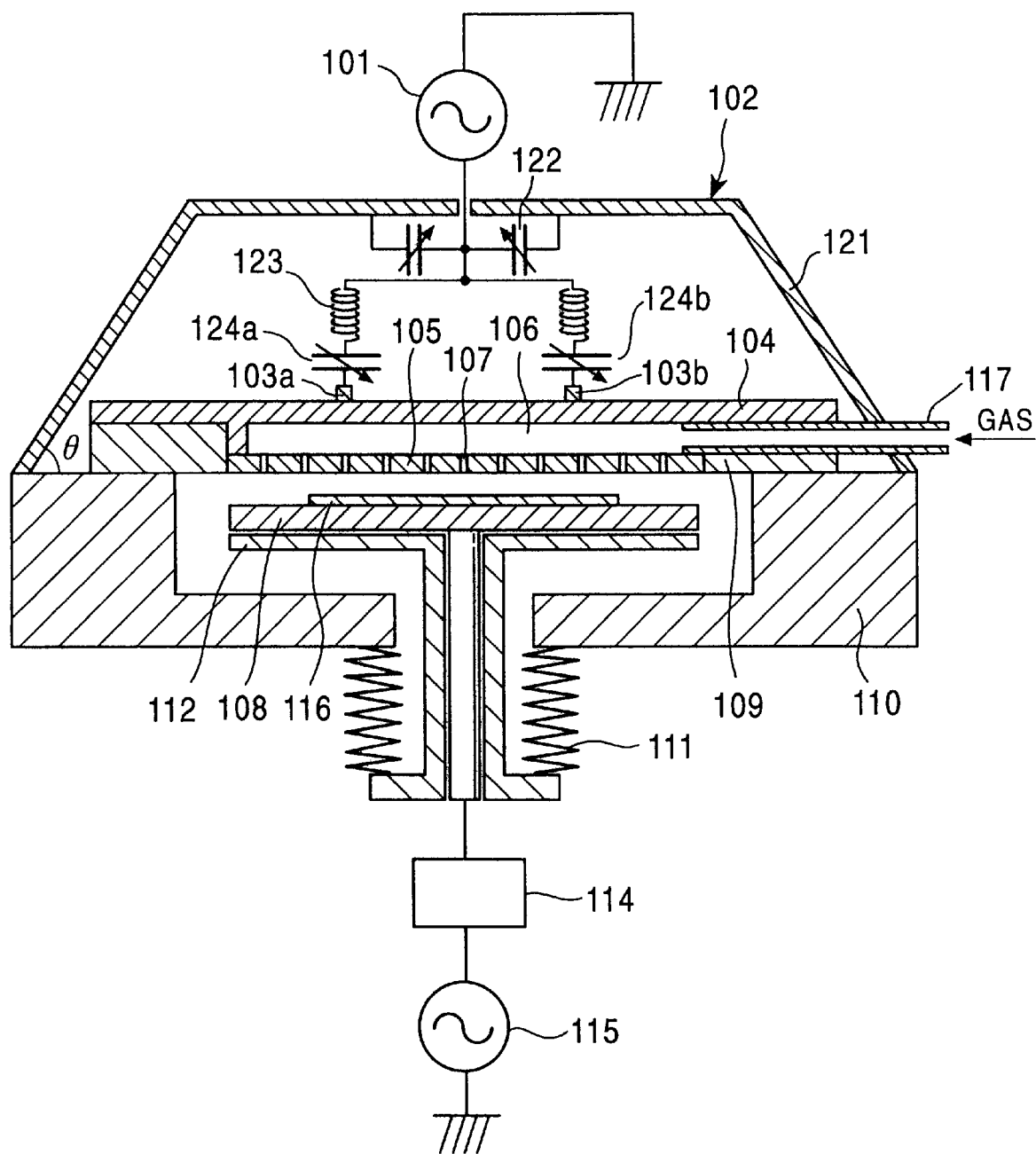
FIG. 14 is a cross section of a plasma processing apparatus according to a sixth embodiment.

FIG. 14 shows a plasma processing apparatus according to a sixth embodiment of the present invention.

In the present embodiment, a plurality of tuning capacitors and a plurality of feeders are provided. Namely, a tuning capacitor 124a and a feeder 103a connected thereto in series, and a tuning capacitor 124b and a feeder 103b connected thereto in series are provided.

If the size (the longest distance from the center, where power is supplied, to a peripheral of the electrode) of a plasma excitation electrode 104 is larger than one fourth the wavelength of a plasma excitation signal, a standing wave causes a problem. Namely, a plasma density has some distribution and uniform film thickness and uniform film quality are impeded on the substrate. Generally, it is preferred that the size of the plasma excitation electrode 104 be smaller than one tenth the wavelength of the plasma excitation signal. In the present embodiment, the foregoing problem is avoided because a plurality of tuning capacitors 124a and 124b are provided. It is also preferred that the shortest distance between adjacent tuning capacitors be smaller than one tenth the wavelength of the plasma excitation signal, which is sufficiently smaller than the wavelength.

A silicon nitride film was formed with the use of the plasma processing apparatus of the present embodiment and the conventional plasma processing apparatus shown in FIG. 18, and power consumption efficiency, a film forming speed, and dielectric strength were measured. In the plasma processing apparatus of the present embodiment, the power consumption efficiency was about 1.5 times larger, the film forming speed was about 1.2 times larger, and the dielectric strength was about 1.2 times larger than in the plasma processing apparatus shown in FIG. 18. A standing-wave-related problem was not generated.

The following film forming conditions were used.
Substrate temperature: 300° C.
Power of high-frequency power source 101: 400 W
Power of high-frequency power source 115: 0 W
Gas: $SiH_4$:$NH$,:$N_2$=40:160:600 (sccm)

Seventh Embodiment

Figure 15:
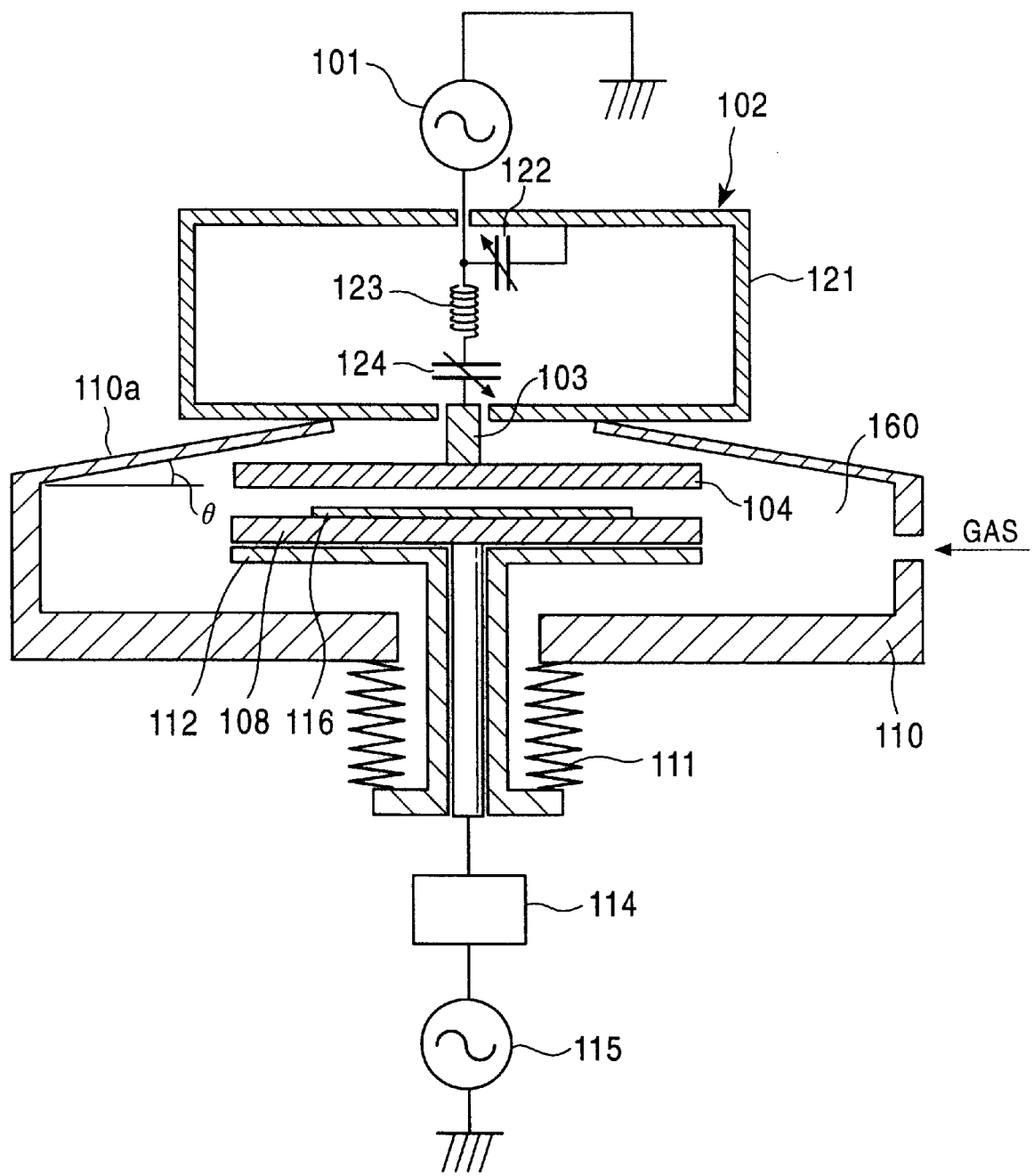
FIG. 15 is a cross section of a plasma processing apparatus according to a seventh embodiment.

FIG. 15 shows a plasma processing apparatus according to a seventh embodiment of the present invention.

Figure 19:
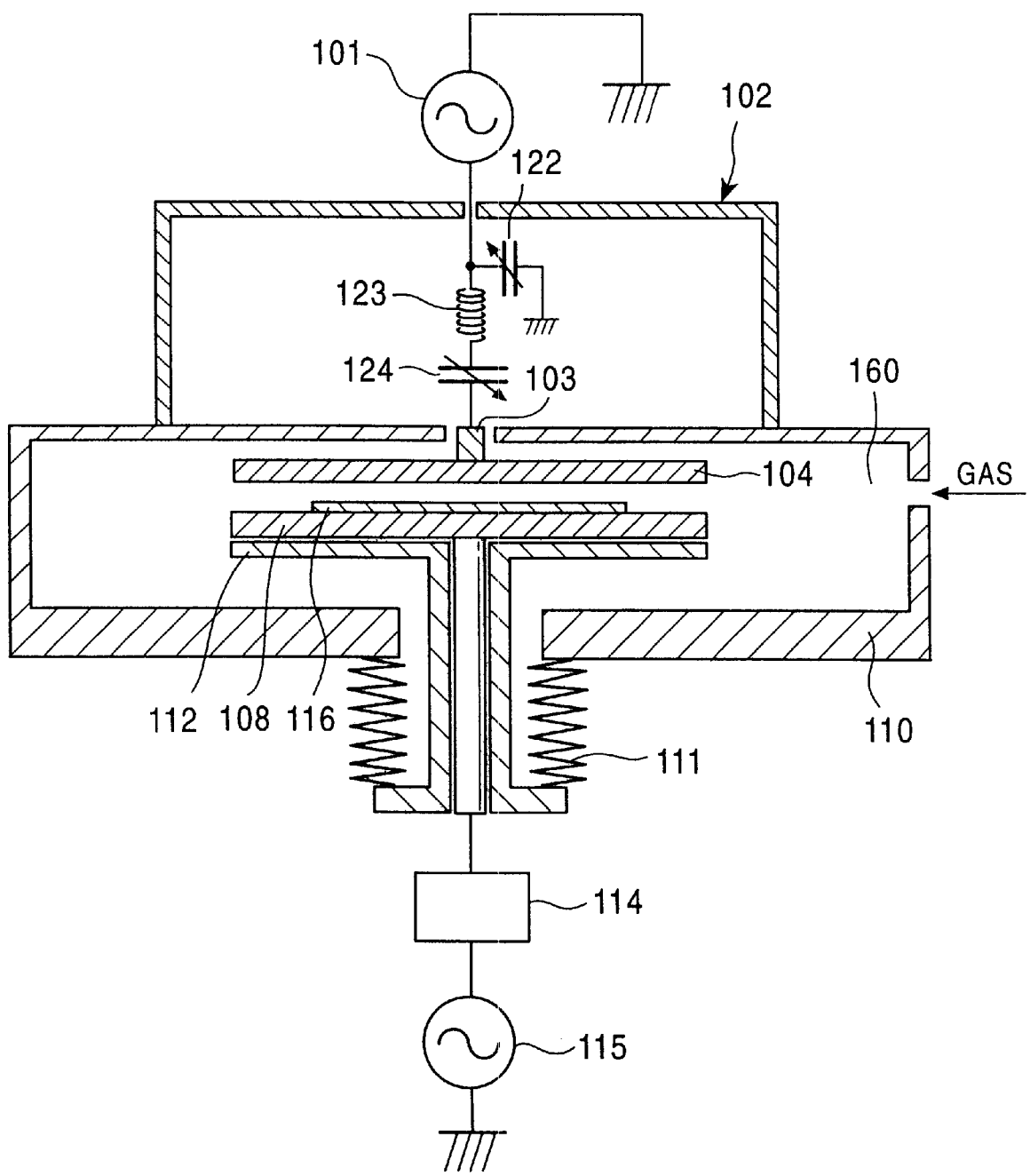
FIG. 19 is a cross section of yet another conventional plasma processing apparatus.

The present embodiment shows a modification of the plasma processing apparatus shown in FIG. 19, in which the feeder 103 is disposed outside the matching box 102.

The feeder 103 for supplying high-frequency electric power from a high-frequency power source 101 to a plasma excitation electrode 104 through a matching circuit intervening between the high-frequency power source 101 and the plasma excitation electrode 104 for achieving impedance matching between the high-frequency power source 101 and the plasma excitation electrode 104 is formed in a plasma processing chamber 160 not in parallel to the side wall 110a above the plasma excitation electrode 104, of the plasma processing chamber 160

In the present embodiment, the feeder 103 is formed in the normal direction to the plasma excitation electrode 104, and also formed at an angle with the side wall 110a above the plasma excitation electrode 104 in the plasma processing chamber 160.

Only one feeder is provided in the present embodiment. The plurality of feeders may be formed. In that case, it is preferred that they be disposed so as to be symmetric about the center of the plasma excitation electrode 104.

In the present embodiment, an angle θ is set to about 15 degrees.

The other configurations are the same as those in the fifth embodiment.

A silicon nitride film was formed with the use of the plasma processing apparatus of the present embodiment and the conventional plasma processing apparatus shown in FIG. 19, and power consumption efficiency, a film forming speed, and dielectric strength were measured. In the plasma processing apparatus of the present embodiment, the power consumption efficiency was about 1.3 times larger, the film forming speed was about 1.1 times larger, and the dielectric strength was about 1.1 times larger than in the plasma processing apparatus shown in FIG. 19.

The following film forming conditions were used.

Substrate temperature: 300° C.

Power of high-frequency power source 101: 400 W

Power of high-frequency power source 115: 0 W

Gas: $SiH_4:NH_3:N_2=40:160:600$ (sccm)

Eighth Embodiment

Figure 16:
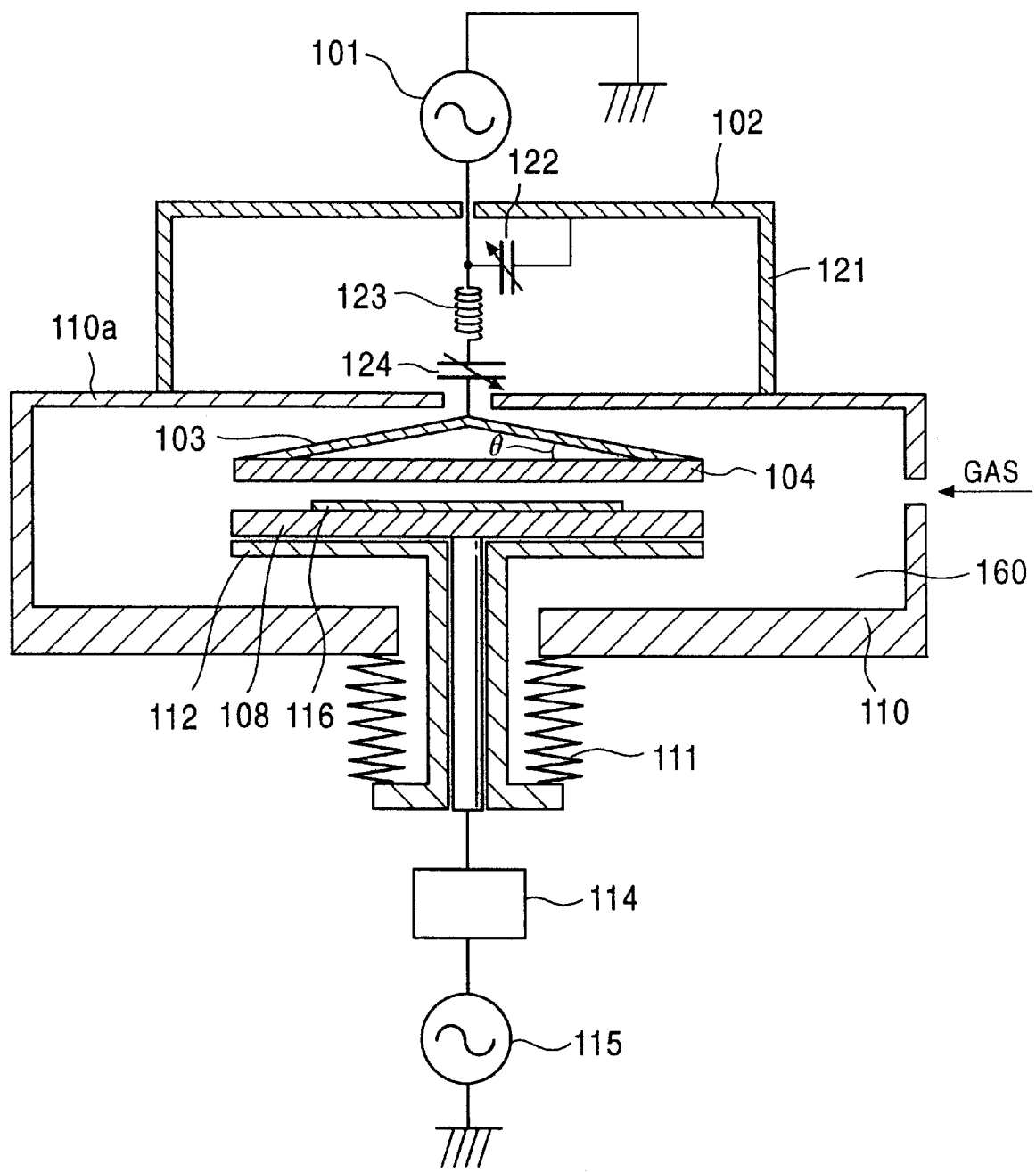
FIG. 16 is a cross section of a plasma processing apparatus according to an eighth embodiment.

FIG. 16 shows a plasma processing apparatus according to an eighth embodiment of the present invention.

In the present embodiment, the side wall 110a of a plasma processing chamber 160 above a plasma excitation electrode 104 is formed in the normal direction to the plasma excitation electrode 104. A feeder 103 is formed in a cone shape such that the feeder 103 is disposed at an angle with the side wall (not in parallel to each other).

Only one feeder is provided in the present embodiment. The plurality of feeders may be formed. In that case, it is preferred that they be disposed so as to be symmetric about the center of the plasma excitation electrode 104.

In the present embodiment, an angle θ is set to about 15 degrees.

The other configurations are the same as those in the fifth embodiment.

A silicon nitride film was formed with the use of the plasma processing apparatus of the present embodiment and the conventional plasma processing apparatus shown in FIG. 19, and power consumption efficiency, a film forming speed, and dielectric strength were measured. In the plasma processing apparatus of the present embodiment, the power consumption efficiency was about 1.3 times larger, the film forming speed was about 1.1 times larger, and the dielectric strength was about 1.1 times larger than in the plasma processing apparatus shown in FIG. 19.

The following film forming conditions were used.

Substrate temperature: 300° C.

Power of high-frequency power source 101: 400 W

Power of high-frequency power source 115: 0 W

Gas: $SiH_4:NH_3:N_2=40:160:600$ (sccm)

The feeder has a cone shape in FIG. 16. It may have a truncated cone shape, a pyramid shape, or a truncated pyramid shape.

Ninth Embodiment

Figure 17:
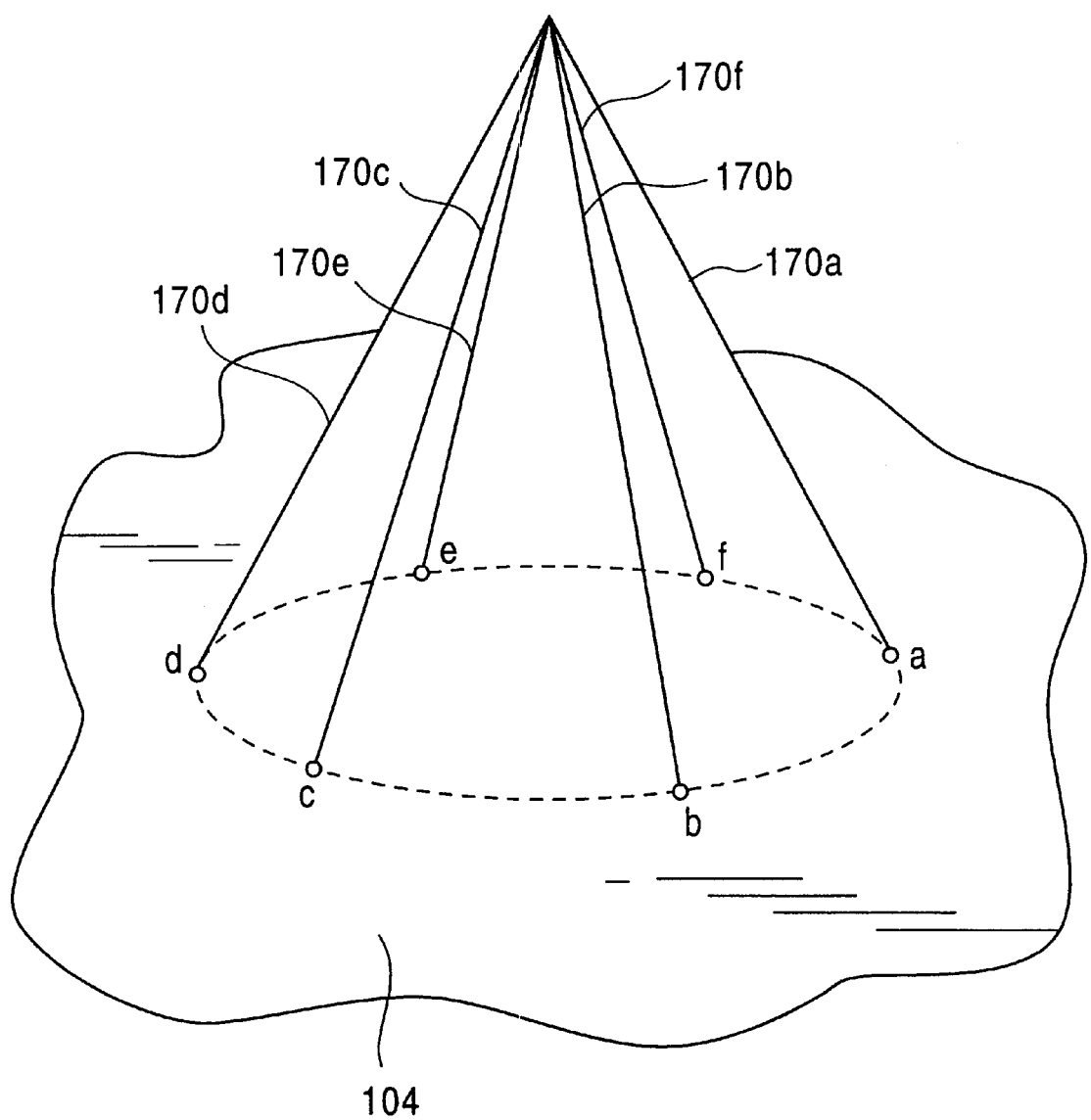
FIG. 17 is a perspective view of a feeder in a plasma processing apparatus according to a ninth embodiment.

The feeder 103 is of an integrated cone-shaped type in the eighth embodiment. In a ninth embodiment, as shown in FIG. 17, a feeder 103 is formed of a plurality of conductive wires 170a, 170b, 170c, 170d, 170e, and 170f. They are disposed to form a cone shape or a pyramid shape, and connected to a plasma excitation electrode 104 at points "a," "b," "c," "d," "e," and "f."

The points "a" and "d," the points "b" and "e," and the points "c" and "f" are symmetric about the center point of the plasma excitation electrode 104.

What is claimed is:

1. A plasma processing apparatus comprising:

a high-frequency power source; and a matching circuit for receiving a high-frequency electric power output from said high-frequency power source;

wherein said matching circuit comprises a tuning capacitor;

one electrode of the tuning capacitor is disposed opposite a wafer susceptor and cooperates with the wafer susceptor to also serve as a plasma excitation electrode for exciting plasma; and the tuning capacitor adjusts the impedance between said high-frequency power source and the plasma excitation electrode to damp a reflection wave caused by a high-frequency wave applied by said high-frequency power source on the plasma excitation electrode, and prevents a reduction in power consumption efficiency, due to the resistance of the inductance between said matching circuit and the plasma excitation electrode.

2. A plasma processing apparatus according to claim 1, wherein the tuning capacitor is a butterfly capacitor.

3. A plasma processing apparatus according to claim 1, wherein the tuning capacitor is a screw capacitor.

4. A plasma processing apparatus according to claim 1, wherein a plurality of at least the tuning capacitors are formed in parallel.

5. A plasma processing apparatus according to claim 4, wherein the plurality of the tuning capacitors are disposed substantially symmetrically about the center of the plasma excitation electrode.

6. A plasma processing apparatus comprising:

a high-frequency power source; and a matching circuit for receiving a high-frequency electric power output from said high-frequency power source;

wherein said matching circuit comprises a tuning capacitor and a fixed capacitor electrically connected to the tuning capacitor;

one electrode of the fixed capacitor is disposed opposite a wafer susceptor and cooperates with the wafer susceptor to also serve as a plasma excitation electrode for exciting plasma; and the tuning capacitor adjusts the impedance between said high-frequency power source and the plasma excitation electrode to damp a reflection wave caused by a high-frequency wave applied by said high-frequency power source on the plasma excitation electrode, and prevents a reduction in power consumption efficiency, due to the resistance of the inductance between said matching circuit and the plasma excitation electrode.

7. A plasma processing apparatus according to claim 6, wherein a plurality of at least the fixed capacitors are formed in parallel.

8. A plasma processing apparatus according to claim 7, wherein the plurality of the fixed capacitors are disposed substantially symmetrically about the center of the plasma excitation electrode.

9. A plasma processing apparatus according to claim 6, wherein the tuning capacitor is a butterfly capacitor.

10. A plasma processing apparatus according to claim 6, wherein the tuning capacitor is a screw capacitor.

11. A plasma processing apparatus, comprising a housing having a side wall, wherein the side wall of the housing is made from an electrically conductive member serving as part of the path of a high-frequency current flowing from a susceptor electrode to the around of a high frequency power source and accommodating a matching circuit intervening between the high-frequency power source and a plasma excitation electrode for achieving impedance matching between the high-frequency power source and the plasma excitation electrode and a feeder for supplying high-frequency electric power from the high-frequency power source to the plasma excitation electrode through the matching circuit which is formed not in parallel to the direction in which the feeder extends, so that a reduction in high-frequency power consumption efficiency, due to mutual inductance with the feeder, is avoided.

12. A plasma processing apparatus according to claim 11, wherein the feeder is formed in the normal direction to the plasma excitation electrode and the side wall of the housing is formed at an angle with the feeder.

13. A plasma processing apparatus according to claim 11, wherein the side wall of the housing is formed in the normal direction to the plasma excitation electrode and the feeder is formed at an angle with the side wall of the housing.

14. A plasma processing apparatus, comprising a feeder for supplying high-frequency electric power from a high-frequency power source to a plasma excitation electrode in a plasma processing chamber through a matching circuit intervening between the high-frequency power source and the plasma excitation electrode for achieving impedance matching between the high-frequency power source and the plasma excitation electrode, wherein said feeder is formed in the plasma processing chamber not in parallel to the side wall, which serves as a part of the path of a high-frequency current flowing from a susceptor electrode to the ground of the high-frequency power source above the plasma excitation electrode, of the plasma processing chamber so that a reduction in high-frequency power consumption efficiency, due to mutual inductance with the side wall, is avoided.

15. A plasma processing apparatus according to claim 14, wherein the feeder is formed in the normal direction to the plasma excitation electrode and the side wall of the plasma processing chamber is formed at an angle with the feeder.

16. A plasma processing apparatus according to claim 14, wherein the side wall of the plasma processing chamber is formed in the normal direction to the plasma excitation electrode and the feeder is formed at an angle with the side wall of the plasma processing chamber.

17. A matching box comprising:

an impedance matching circuit;

a feeder for supplying a high-frequency current output from said impedance matching circuit; and a housing made from an electrically conductive member and accommodating said matching circuit and said feeder;

wherein said housing has a cone shape, a truncated cone shape, a pyramid shape, or a truncated pyramid shape so that a reduction in hiqh-frequency power consumption efficiency, due to mutual inductance with the feeder, is avoided.

18. A matching box comprising:

an impedance matching circuit;

a feeder for supplying a high-frequency current output from said matching circuit; and a housing made from an electrically conductive member and accommodating said matching circuit and said feeder;

wherein said feeder has one of a cone shape, a truncated cone shape, a pyramid shape, and a truncated pyramid shape so that a reduction in high-frequency power consumption efficiency, due to mutual inductance with the housing, is avoided.

* * * * *